US008501596B2

(12) United States Patent
Vincent et al.

(10) Patent No.: US 8,501,596 B2
(45) Date of Patent: Aug. 6, 2013

(54) METHOD FOR FABRICATING A MICRO-ELECTRONIC DEVICE EQUIPPED WITH SEMI-CONDUCTOR ZONES ON AN INSULATOR WITH A HORIZONTAL GE CONCENTRATION GRADIENT

(75) Inventors: Benjamin Vincent, Ixelles (BE); Vincent Destefanis, Saint Egreve (FR)

(73) Assignee: Commissariat a l'Energie Atmoique, Paris (FR)

( * ) Notice: Subject to any disclaimer, the term of this patent is extended or adjusted under 35 U.S.C. 154(b) by 964 days.

(21) Appl. No.: 12/560,867

(22) Filed: Sep. 16, 2009

(65) Prior Publication Data
US 2010/0068869 A1    Mar. 18, 2010

(30) Foreign Application Priority Data
Sep. 18, 2008   (FR) ...................................... 08 56303

(51) Int. Cl.
*H01L 21/20* (2006.01)
*H01L 21/36* (2006.01)

(52) U.S. Cl.
USPC ........... 438/492; 438/285; 438/481; 438/488; 438/503; 438/507; 438/590

(58) Field of Classification Search
USPC .................. 438/285, 481, 488, 492, 503, 507, 438/590
See application file for complete search history.

(56) References Cited

U.S. PATENT DOCUMENTS

| 4,579,621 | A | * | 4/1986 | Hine ................................. 117/95 |
| 5,926,725 | A | * | 7/1999 | Saihara et al. ................. 438/481 |
| 6,074,478 | A | * | 6/2000 | Oguro ............................. 117/95 |
| 7,598,145 | B2 |   | 10/2009 | Damlencourt et al. |
| 7,601,570 | B2 |   | 10/2009 | Damlencourt |
| 2005/0269595 | A1 | * | 12/2005 | Tezuka ........................ 257/183 |
| 2005/0285192 | A1 |   | 12/2005 | Zhu |
| 2007/0108481 | A1 |   | 5/2007 | Thean et al. |
| 2007/0235759 | A1 | * | 10/2007 | Henson et al. ................ 257/192 |
| 2007/0284625 | A1 |   | 12/2007 | Damlencourt et al. |
| 2008/0042209 | A1 |   | 2/2008 | Tan et al. |
| 2008/0220594 | A1 | * | 9/2008 | Clavelier et al. ............. 438/492 |

OTHER PUBLICATIONS

U.S. Appl. No. 12/525,756, filed Aug. 4, 2009, Vincent, et al.
B. Vincent, et al., "Fabrication of SiGe-on-insulator substrates by a condensation technique: an experimental and modeling study", Semiconductor Science and Technology, vol. 22, No. 3, XP20114949, Mar. 1, 2007, pp. 237-244.
Shinichi Takagi, et al., "Hole mobility enhancement of p-MOSFETs using global and local Ge-channel technologies", Materials Science Engineering B, vol. 135, No. 3, XP025100213, Dec. 15, 2006, pp. 250-255.
Tsutomu Tezuka, et al., "High-mobility Strained SiGe-on-Insulator pMOSFETs With Ge-Rich Surface Channels Fabricated by Local Condensation Technique", IEEE Electron Device Letters, vol. 26, No. 4, XP011128536, Apr. 1, 2005, pp. 243-245.

(Continued)

Primary Examiner — Bac Au
(74) Attorney, Agent, or Firm — Oblon, Spivak, McClelland, Maier & Neustadt, L.L.P.

(57) ABSTRACT

A manufacturing method of a microelectronic device including at least one semi-conductor zone which rests on a support and which exhibits a germanium concentration gradient in a direction parallel to the principal pane of the support.

12 Claims, 9 Drawing Sheets

$E_{Si1-x}Ge_x$

OTHER PUBLICATIONS

Tsutomu Tezuka, et al., "A New Strained-SOI/GOI Dual CMOS Technology Based on Local Condensation Technique", Symposium on VLSI Technology Digest of Technical Papers, XP010818180, Jun. 14-16, 2005, pp. 80-81.

Tsutomu Tezuka, et al., "A Novel Fabrication Technique of Ultrathin and Relaxed SiGe Buffer Layers with High Ge Fraction for Sub-100 nm Strained Silicon-on-Insulator MOSFETs", Japanese Journal of Applied Physics, vol. 40, (2001), pp. 2866-2874.

A. Erko, et al., "Laterally-Graded SiGe Crystals for High Resolution Synchrotron Optics", Cryst. Res. Technol., vol. 37, No. 7, (2002), pp. 685-704.

Tohru Aoyama, et al., "Facet formation mechanism of silicon selective epitaxial layer by Si ultrahigh vacuum chemical vapor deposition", Journal of Crystal Growth, vol. 136, (1994), pp. 349-354.

* cited by examiner

METHOD FOR FABRICATING A MICRO-ELECTRONIC DEVICE EQUIPPED WITH SEMI-CONDUCTOR ZONES ON AN INSULATOR WITH A HORIZONTAL GE CONCENTRATION GRADIENT

TECHNICAL FIELD

The invention relates to the field of micro-electronics, and more specifically to the realization of a micro-electronic device equipped with semi-conductor zones which include a horizontal Ge concentration gradient.

The invention also provides an improved method for the realization of locally disoriented surfaces from such semi-conductor zones.

THE EXISTING STATE OF THE TECHNIQUE

It is beneficial to equip microelectronic devices with semi-conductor zones based on $Si_{1-b}Ge_b$ insofar as on the one hand this material possesses good charge transport properties, in particular better charge carrier mobility than silicon, and on the other hand this material possesses good mechanical properties and may be used to exert mechanical strain on neighbouring layers based, for example, on Si.

The realization of semi-conductor zones based on $Si_{1-b}Ge_b$ enriched with Germanium is known using a method referred to as Germanium condensation in which thermal oxidation of zones based on $Si_{1-a}Ge_a$ is carried out. Such a method is described, for example, in the document by Tezuka et al: "*A novel fabrication technique of ultrathin and relaxed SiGe Buffer layers with high Ge fraction for sub-100 nm strained Silicon on Insulator MOSFETs*".

In this document, a method for the realization of zones based on SiGe which include a vertical Ge concentration gradient is reported.

The formation of layers referred to as "virtual substrates" obtained through growth by epitaxy using Ge and Si precursor gases, by varying the proportion of these gases during growth, is known. This also allows semi-conductor zones based on $Si_{1-b}Ge_b$ which have a Ge concentration gradient to be obtained.

The realization of zones based on $Si_{1-a}Ge_a$ with a horizontal Ge concentration gradient is known, and has been reported, for example, in the document: "Laterally graded SiGe crystals for high resolution synchrotron Optics" A. Erko, N. V. Abrosimov and V. Alex, Cryst. Res. Technol. 37 (2002)7 685. Such a method includes the growth of SiGe crystals which contain a SiGe gradient. Such a method has the drawback of being difficult to implement, of being costly, of producing significant crystal defects and of being unsuitable for substrates of diameter greater then 200 mm.

The problem arises of finding a new micro-electronic method for making one or more semi-conductor zones with a Ge concentration gradient on a substrate.

PRESENTATION OF THE INVENTION

The invention relates to a method for the fabrication of semi-conductor zones based on $Si_{1-z}Ge_z$ alloy on an insulator and which exhibit a gradient in Ge concentration z. From center to periphery of said center semi-conductor zone, the Ge content increase Within this alloy z can vary, in a lateral direction, from 0 to 1.

The method may include steps for:

a) The formation, on a support, of at least one oxidation masking layer which includes one or more holes, where the holes reveal at least one first semi-conductor zone, in particular based on Si, and which include inclined flanks and comprises a central portion and a periphery portion with a thickness inferior to the thickness of central portion, b) The formation of at least one second semi-conductor zone based on $Si_{1-x}Ge_x$ (where 0<x) on said first semi-conductor zone based on Si, c) Thermal oxidation of said first semi-conductor zone and the second semi-conductor zone through said masking.

The first semi-conductor zone and said second semi-conductor zone can form a block with a ration $Si_{1-x}Ge_x$ thickness compared to Si thickness ($ESi_{1-x}Ge_x/ESi$) increasing from centre to periphery of said block.

The support may be a semi-conductor on insulator substrate, specifically an SOI substrate, which includes a support layer, an insulating layer resting on said support layer, and a thin semi-conductor layer resting on said insulating layer.

The oxidation masking layer may be provided with a thickness (Emasque) which is greater than the thickness Esi of the first semi-conductor zone.

The first semi-conductor zone may be a layer based on Si formed by growth on the thin semi-conductor layer which may also be based on Si.

According to one option step a) may include:

The formation of one or more openings in the thin semi-conductor layer revealing said insulation layer of the substrate.

The formation of a masking layer which fills in said openings.

Growth on the thin semi-conductor layer of the first semi-conductor zone.

According to one option, the second semi-conductor zone may be formed at step b) so that it extends beyond the hole openings, where the method also includes: polishing of the second semi-conductor zone up to the level of the masking layer.

According to one possible implementation of the method, the latter may in addition include, between step b) and step c): the removal of a thickness of the second semi-conductor zone and of the masking layer, so as to reveal the first semi-conductor zone.

The method may include, after step c), the removal of said masking layer and of at least one layer of $SiO_2$ formed during oxidation.

According to one option for implementation, the second semi-conductor zone based on $Si_{1-x}Ge_x$ may have a Ge concentration of between 5% and 40%.

The invention also relates to a method for the realization of at least one locally disoriented zone on one or more of said semi-conductor zones, which exhibits a Germanium concentration gradient in a direction parallel to the principal plane of the support, formed using a method such as described above.

The invention also relates to a method for the realization of at least one heterojunction formed from at least one given semi-conductor zone exhibiting a first Germanium concentration gradient in a direction parallel to the principal plane of the support, and from at least one other semi-conductor zone next to said given zone and which exhibits a second Germanium concentration gradient in a direction parallel to the principal plane of the support, with said given zone and said other zone having been formed using a method such as described above.

The invention also relates to a method for the realization of at least one MOS transistor from one or more semi-conductor zones, which exhibit a first Germanium concentration gradient in a direction parallel to the principal plane of the support, formed using a method such as described above.

BRIEF DESCRIPTION OF THE DIAGRAMS

The present invention will be better understood by reading the description of examples of fabrication, which are given for purely informative purposes and which are in no way limitative, whilst referring to the appended diagrams in which:

FIGS. 11A, 11B respectively illustrate an Si surface which is not disoriented and a disoriented Si surface Identical, similar or equivalent parts of the various figures bear the same numerical references so as to facilitate moving from one figure to another.

In order to make the figures more readable, the various parts represented in the figures are not necessarily shown at a uniform scale.

DETAILED DESCRIPTION OF SPECIFIC EMBODIMENTS

An example of the method according to the invention for making a microelectronic device equipped with one or more semi-conductor zones based on $Si_{1-z}Ge_z$ (where $0<z\leq1$) resting on a substrate and which exhibit a Ge concentration gradient in a horizontal direction, that is, parallel to the substrate, will now be given in association with FIGS. 1A to 1F.

Figure 1A:
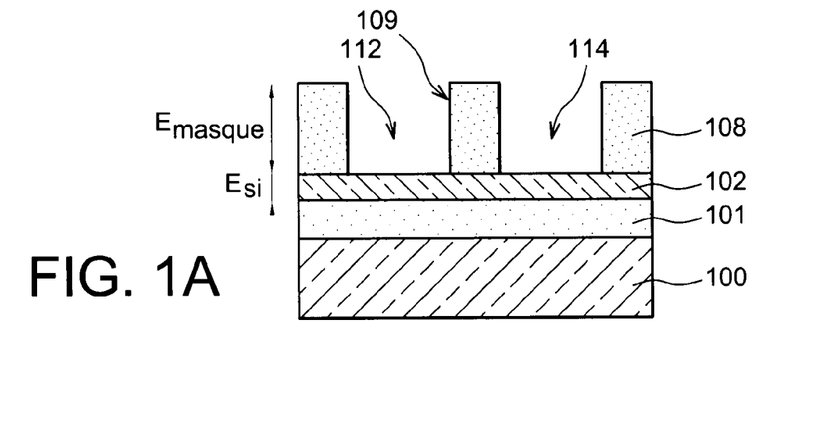
FIGS. 1A-1F illustrate an example of the method according to the invention, for the realization of a microelectronic device which includes semi-conductor zones based on $Si_{1-z}Ge_z$ which exhibit a horizontal Ge concentration gradient and which are located on either side of a semi-conductor zone based on Si.

The starting material for the method is a semi-conductor on insulator type substrate, for example of the SOI ("silicon on insulator") type, which includes a support layer 100 which is for example, based on Si, covered with a layer of dielectric material, 101, for example a buried $SiO_2$ silica (or "buried oxide") layer, itself covered with a thin semi-conductor layer 102, which is, for example, based on Si and whose thickness $E_{si}$ is, for example, between 5 and nanometers or, for example, of the order of 10 nanometers.

An oxidation masking layer is then made on the semi-conductor layer 102 based on Si. The masking layer may be formed of at least one layer 108 which may be based on dielectric material, for example $Si_xN_y$, in particular $Si_3N_4$, or possibly a stack of several layers of dielectric material(s).

The masking layer 108 may be made by deposition and may have a thickness $E_{masque}$ which is for example of the order of 100 nanometers or of several hundred nanometers, or may, for example, be between 10 and 500 nanometers.

Holes 112, 114, are then made in the layer 108 of dielectric material. The holes 112, 114, are made so as to reveal the layer 102 based on Si. The holes 112, 114, may be made, for example, by a method which includes at least one step involving photolithography or electron beam lithography (FIG. 1A).

Figure 1B:
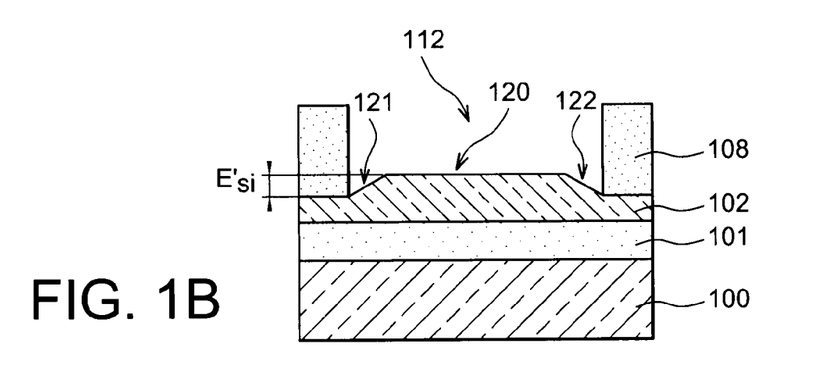

Semi-conductor zones 120 based on Si are then formed on the semi-conductor layer 102, in the holes 112, 114.

These zones 120 based on Si may be formed by localised Si growth through epitaxy on the semi-conductor layer 102. The thickness $E'_{Si}$ of the zones 120 based on Si is less than that $E_{masque}$ of the masks so that $E'_{Si}<E_{masque}$.

The thickness $E'_{Si}$ of the zones 120 based on Si is less than the thickness Emasque, for example of the order of 50 nanometers.

The zones 120 based on Si are formed with inclined flanks which may be oriented along {11n} where n≧1, for example n=1 or n=3. The zones 120 may have inclined flanks 121, 122 which may extend over several tens of nanometers or several hundred nanometers (FIG. 13).

The flanks of zones 120 are obtained using localised epitaxy, carried out at low pressure, for example between 1 Torr and several tens of Torr and at high temperature, for example at a temperature greater then 750° C.

The angle θ between the flanks 109 of the masking layer 108 and the growth plane may be provided as being greater then 80°, for example of the order of 120°, in order to promote the formation of flanks.

Figure 10:
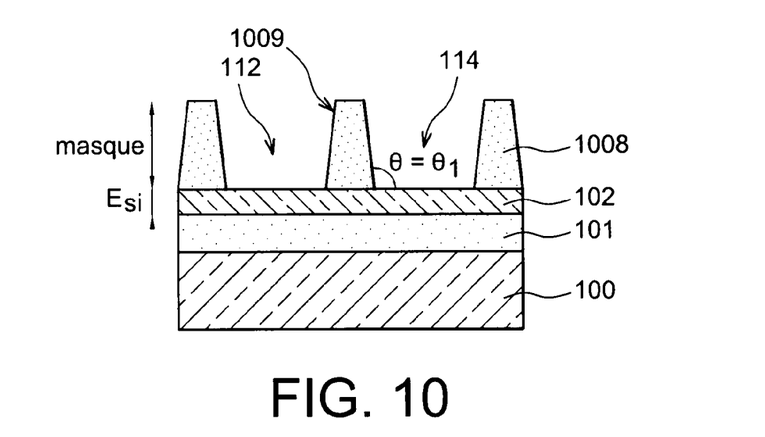
FIG. 10 illustrates a variant of a step in the method according to the invention, used to promote the formation of semi-conductor zones with inclined flanks.

In FIG. 10 an angle θ=θ1, where θ1>90° is envisaged between the flanks 1009 of a masking layer 1008 in order to promote the formation of semi-conductor zones 120 which have inclined flanks.

Control over the angle between the flanks of the masking layer 1008 and the growth plane, based on selective plasma etching, for example between the $SiO_2$ (when the masking is based on $SiO_2$) and the Si of the layer 102, may be implemented. This selectivity relies in particular on the proportion of oxygen present in a gas mixture, for example based on $Cl_2$—HBr—He—$O_2$—$CF_4$. By increasing the proportion of oxygen in the gas mixture, an angle greater than 80° may be obtained between the flanks of the masking layer and the growth plane. Another control factor for this angle between the flanks of the masking layer and the growth plane may be the polarisation applied between the etching plasma and the substrate 100.

Figure 1C:
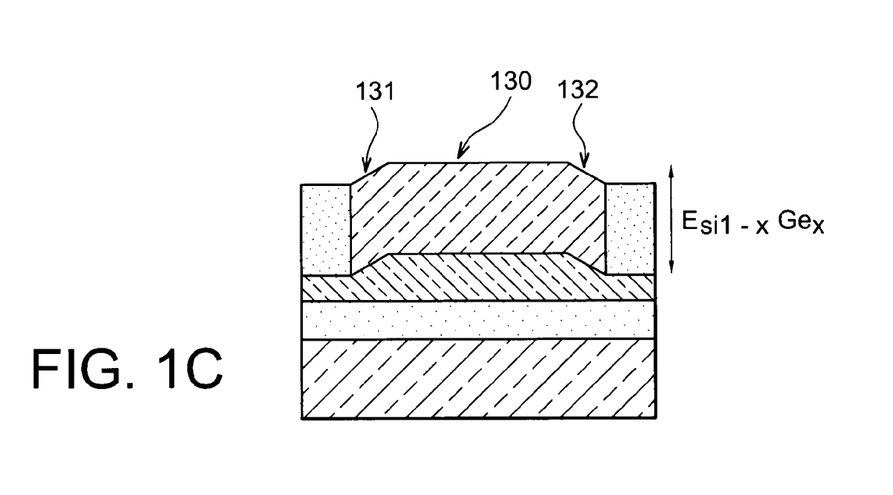

Then, other $Si_{1-x}Ge_x$ semi-conductor zones (where x>0) are formed on the semi-conductor zones 120 by growth through localised epitaxy of $Si_{1-x}Ge_x$ on the semi-conductor zones 120 based on Si.

In this example of fabrication, the thickness $E_{Si1-xGex}$ of the zones 130 based on $Si_{1-x}Ge_x$ may be envisaged so that these zones 130 extend beyond the aperture of the holes 112, 114.

The growth through epitaxy may be such that it leads to the formation of zones 130 of conforming thickness, that is, of constant thickness, where the shape of the zones 130 reproduces that of the zones 120. The zones 130 based on $Si_{1-x}Ge_x$ may possibly include facets or flanks 131, 132, which are inclined along the planes {311} or planes {311} and {111}. The zones 130 based on $Si_{1-x}Ge_x$ may possibly be formed with a significant thickness $E_{Si-x}Ge_x$, so that they exhibit no profile with the inclined flanks.

The zones 130 based on $Si_{1-x}Ge_x$ may be envisaged with a thickness $E_{Si1-x}Ge_x$, of the order of or equal to that of the oxidation masking layer $E_{masque}$. The thickness $E_{Si1-xGex}$ may be selected so that it is less than the plastic relaxation thickness of the $Si_{1-x}Ge_x$ alloy. The $Si_{1-x}Ge_x$ alloy may be selected so that it has a low Ge concentration, for example such that x is between 5 and 40%, for example with a Ge concentration of the order of 30% (FIG. 1C).

For a Ge concentration of the order of 30%, the plastic relaxation thickness may be of the order of 40 nm.

The zones based on $E_{Si1-x}Ge_x$ may possibly be made in the same equipment as that in which the zones 120 based on Si are formed.

Figure 1D:
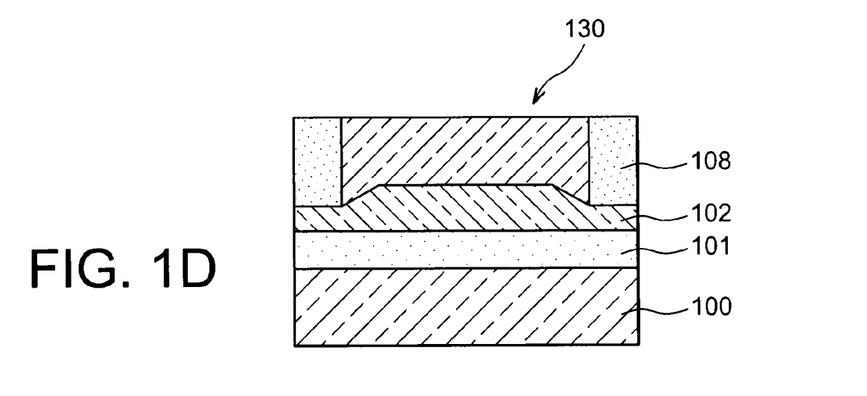

Chemical mechanical polishing ("CMP"—'chemical mechanical planarisation') of the semi-conductor material in the zones 130 which extend beyond the upper face of the layer 108 is then carried out. The polishing may be carried out so that it stops at the oxidation masking layer 108 in order to reduce the semi-conductor zones 130, and in order to obtain a cumulative thickness $E_{Si}+E_{Si1-x}Ge_x$ of the stacked semi-conductor zones 120 and 130 which is equal or approximately equal to that of the layer 108 of the oxidation mask, so that $E_{Si}+E_{Si1-x}Ge_x \approx E_{masque}$ (FIG. 1D).

In each of the holes 112, 114 a semi-conductor block formed by the stacking of an zone based on $Si_{1-x}Ge_x$ alloy on an Si zone with a variable (thickness of $Si_{1-x}Ge_x$/thickness of Si) ratio and in particular an (amount of Ge/amount of Si) ratio which increases from the centre of the block towards the edges or periphery of the block, is obtained.

Figure 1E:
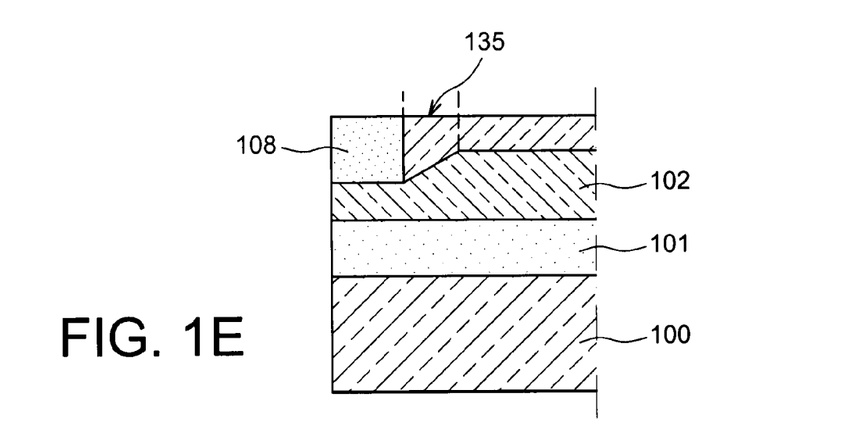

The zone 135 over which the ($E_{SiGe}/E_{Si}$) ratio increases corresponds to a location where the Si zone 120 exhibits inclined flanks. This zone 135 may have a length which is between several tens of nanometers and several hundred nanometers (FIG. 1E).

A step involving localised condensation (FIG. 1F) of the Ge in the semi-conductor zones 130 based on $Si_{1-x}Ge_x$ is then carried out, for example using a selective Si oxidation method, for example dry oxidation at high temperature, for example above 900° C.

Figure 1F:
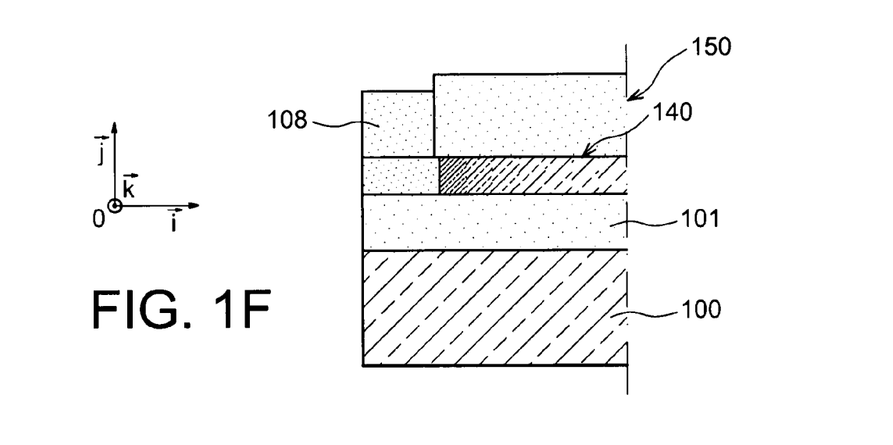

The condensation may be carried out using a condensation method such as that described in the document: <<*A novel fabrication technique of ultrathin and relaxed SiGe buffer layers with high Ge fraction for sub*-100 *nm strained silicon on insulator MOSFETs*, Tezuka et al., *Japanese Journal of Applied Physics*, vol. 40, p 2866-2874, 2001>>.

In order to carry out this Ge condensation, at least one thermal oxidation step of the semi-conductor zones 130 based on $Si_{1-x}Ge_x$ is carried out at high temperature, through the oxidation masking layer formed in the layer 108. The oxidation temperature is preferably lower than the melting points of the $Si_{1-x}Ge_x$ material in the semi-conductor zone 130. The masking elements or masking blocks of the layer 108 may retard or prevent the oxidation of the semi-conductor layer 102. It is possible to block oxidation completely if necessary.

Once the oxygenation step is finished, zones based on $Si_{1-z}Ge_z$ where z>x) are obtained with Germanium compositions or levels of Germanium which vary in a horizontal direction. The zones based on $Si_{1-z}Ge_z$ 140 follow a Germanium concentration gradient in a direction which is parallel to the support 100 or to the principal plane of the support (where the principal plane of the support is defined by a plane which passes through the support 100 and which is parallel to the plane [O; $\vec{i}$; $\vec{k}$] of the orthogonal marker [O; $\vec{i}$; $\vec{j}$; $\vec{k}$] in FIG. 1F).

In the semi-conductor zones 140, the Germanium content varies and increases from the centre 140a of the zones 140 towards the periphery 140b of these zones 140, close to an interface with the thin semi-conductor layer 102.

The semi-conductor zones 140 are based on $Si_{z1}Ge_{1-z1}$ at their centre and based on $Si_{z2}Ge_{1-z2}$ at their periphery 140b, where z2<z1 and where z2 may be close to or approximately equal to 0.

Thus, according to one option, the semi-conductor zones 140 may be based on Ge or highly enriched with Ge at their extremities 140b, close to the oxidation mask.

Once the oxygenation step is finished, the zones based on $Si_{1-z}Ge_z$ zones 140 are topped by a layer based on $SiO_2$ 150 formed during the oxidation. The oxidation mask, and in particular the thickness and composition of this mask, are envisaged so that the semi-conductor layer 102 covered by this mask is left intact (FIG. 1F).

The layer of $SiO_2$ 150 formed during oxidation, as well as the oxidation mask layer 108, is then removed.

The layer 150 of $SiO_2$ may then be removed, for example using wet etching with HF, whereas the layer 108 may, when it is based on $Si_xN_y$, be removed, using for example $H_3PO_4$.

Figure 2A:
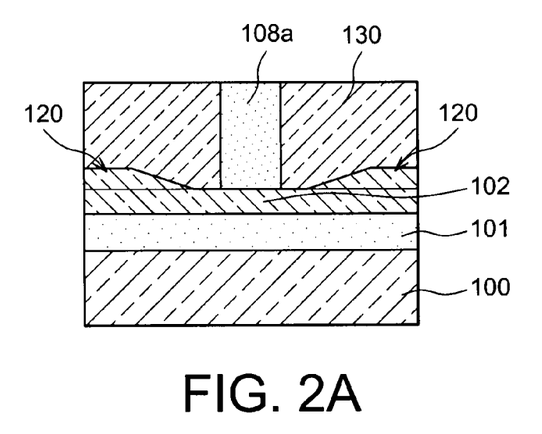
FIGS. 2A-2B illustrate a microelectronic device respectively before and after a step involving germanium condensation by oxidation, during a manufacturing method according to the invention.

In the condensation method used, Germanium is retained so that the final Ge enrichment of the semi-conductor zones based on $Si_{1-z}Ge_z$ depends on the initial ratio between the quantity of Ge and the quantity of Si in the semi-conductor zones 120. Following the condensation method, the rate of variation of the Ge concentration in the semi-conductor zones located in the holes 112, 114 increases from the centre towards the extremities of the Silicon Germanium on insulator or SGOI zones 140. A Ge concentration gradient in a horizontal direction is therefore finally obtained In FIG. 2A, another part of the device formed in step 1D is shown, at a block 108a of the oxidation masking layer 108 formed on the thin semi-conductor layer 102. On either side of this block 108a, semi-conductor zones 120 based on Si which include inclined flanks 121 are each covered by a zone 130 of $Si_{1-x}Ge_x$.

Figure 2B:
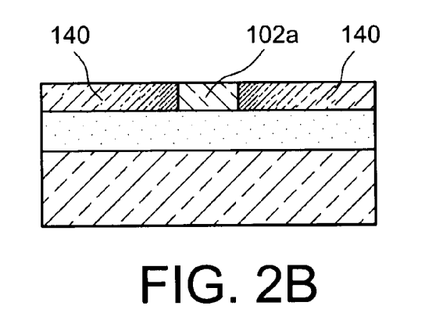

In FIG. 2B, this other part of the device is shown, once the Germanium condensation step has been carried out and the oxidation masking layer and the layer of $SiO_2$ made by oxidation during the Ge condensation method have been removed.

At the location where the block 108a of the oxidation mask 108 is located, there is a zone 102a based on Si which is produced from the thin semi-conductor layer 102. On either side of this zone 102a based on Si are semi-conductor zones 140 based on $Si_{1-z}Ge_z$ (where z>y), which exhibit a Ge concentration gradient in a horizontal direction parallel to the principal plane of the support 100.

Such zones may allow a microelectronic device to be made such as a transistor which includes mechanical stresses, whilst retaining mesh parameter continuity, thus minimising the defects present.

Figure 3A:
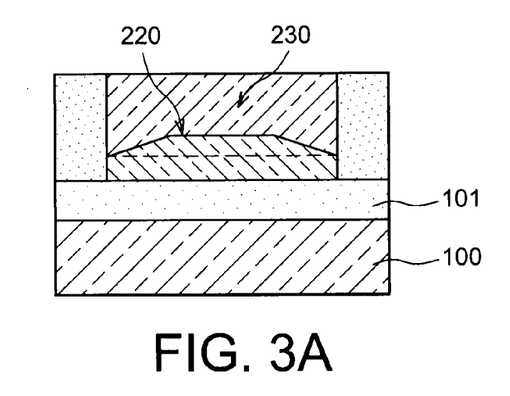
FIGS. 3A-3B: illustrate a method for the realization of an SGOI structure which includes a semi-conductor zone based on $Si_{1-z}Ge_z$ with a horizontal Ge concentration gradient, and which includes a central zone based on SiGe and a peripheral zone based on Ge or which is highly enriched with Ge.
Figure 3B:
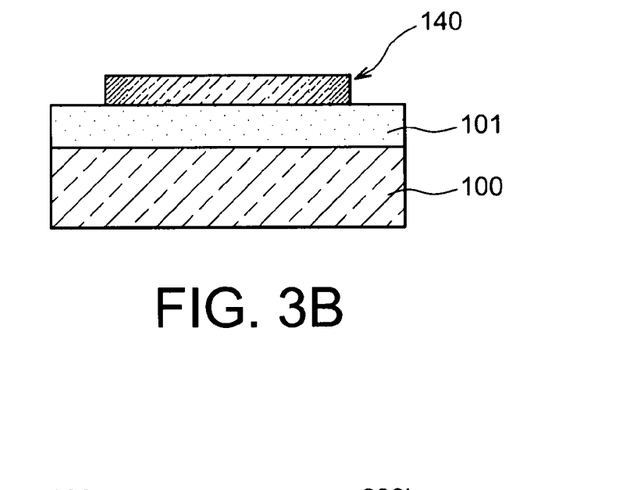

Another example of a fabrication method is given in FIGS. 3A and 3B.

For this variant the starting material may be an SOI substrate as described previously, from which the thin semi-conductor layer 102 has been removed, at one or more locations, using, for example, a method which includes at least one photolithographic step, then silicon etching.

An oxidation mask 208 is then made at the locations where the semi-conductor layer 102 has been removed, and therefore rests on the $SiO_2$ layer 101 of the substrate.

The oxidation masking 208 includes openings in which are formed, on the thin semi-conductive layer 102, a semi-conducting zone 220 based on Si which includes inclined flanks and a semi-conducting zone 230 based on $Si_{1-x}Ge_x$ (where x>0) resting on the zone 220 based on Si (FIG. 3A).

The semi-conductor zones 220 and 230 may be successively formed by growth through epitaxy starting from a portion of the thin semi-conductor layer 102 which has not been etched.

An oxidation step of the zones 220, 230 is carried out at high temperature, through the masking layer 208. The oxidation step consumes the silicon of the thin semi-conductor layer 102 and of the semi-conductor zones 220 and 230 which are respectively based on Si and $Si_{1-x}Ge_x$.

The masking layer 208 may have a thickness of the order, for example, of 100 nanometers or of several hundred nanometers, or which may be for example between 10 and 500 nanometers.

The thickness of the zones 220, 230 is less than the thickness of the mask 208, for example of the order of 50 nanometers.

Once the oxidation step is finished, and the masking layer 208 as well as a layer of $SiO_2$ resulting from this oxidation removed, at least one zone based on $Si_{1-z}Ge_z$ (where z>0) is obtained which includes a concentration gradient in a horizontal direction and which rests directly on the insulating layer 101 of the substrate.

According to one variant (FIGS. 4A and 4B) of the example of the fabrication method which has just been described, there is made on the buried oxide layer 101 an oxidation masking layer 208, which is for example based on $Si_3N_4$ and which includes openings in which blocks of semi-conductors are formed of the same height or approximately of the same height as the masking layer 208.

Figure 4A:
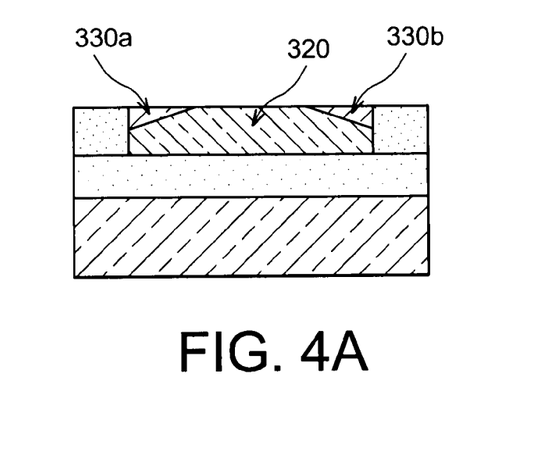
FIGS. 4A-4B illustrate a method for the realization of an SGOI structure which includes a semi-conductor zone based on $Si_{1-z}Ge_z$ with a horizontal Ge concentration gradient, and which includes a central zone based on Si and a peripheral zone based on Ge or which is highly enriched with Ge.

The semi-conductor blocks may be formed of a zone 330 based on Si which includes covered facets of zones 340a and 340b based on $Si_{1-x}Ge_x$, where the zones 340a and 340b have an arrangement which is such that said blocks are flat.

The semi-conductor blocks may have been formed using at least one chemical mechanical polishing (CMP) step, for example through a polishing step of a device such as described previously in association with FIG. 3A of the semi-conductor zone 240, leading to the removal of a given thickness of the oxidation mask 208 and of a thickness of the semi-conductor zone 240, which is equal or approximately equal to the given thickness and which allows the upper face of the zone 330 to be revealed (FIG. 4A).

Figure 4B:
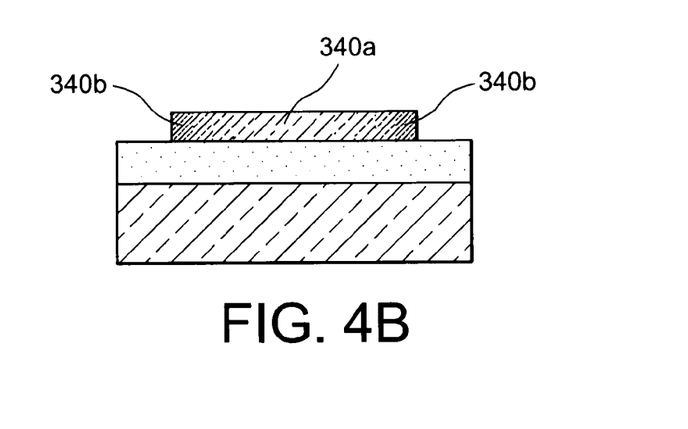

A step involving condensation of germanium by oxidation of the semi-conductor block is then carried out, through the oxidation masking layer 208. The oxidation step is carried out so that the silicon in the semi-conductor zones 340a and 340b based on $Si_{1-x}Ge_x$ is consumed.

Once the oxidation step is finished, the masking layer 208, as well as a layer of $SiO_2$ resulting from the oxidation of the Si during the Germanium condensation method, are removed.

At least one semi-conductor zone 340 is therefore obtained which includes a Ge concentration gradient in a horizontal direction, that is, parallel to the support 100, and resting directly on the insulating layer 101. At the centre 340a of the semi-conductor zone, the latter is made up of Si from the semi-conductor zone 230 and from the thin semi-conductor layer 102.

The ends 340a, 340b of the semi-conductor zone 340 are based on $Si_{1-w}Ge_w$ (where w>y), and result from the oxidation of semi-conductor zones 330a, 330b based on $Si_{1-y}Ge_y$ of variable thickness, and exhibit a Ge concentration gradient, where the Ge concentration increases in the centripetal directions of the semi-conductor zone 350 and parallel to the support 100 (FIG. 4B).

A structure which includes one or more SiGe on insulator (SGOI) zones with a Ge concentration gradient as described previously may be used to fabrication locally disoriented semi-conductor zones.

Locally disoriented surfaces may be obtained using localised epitaxy. From the SiGe zones previously obtained, locally disoriented surfaces may be obtained by etching or by oxidation whose kinetics are dependent on the Ge concentration.

The surfaces obtained are of type {11n} where n may be equal to several tens of units.

Locally disoriented zones may be used as a III-V semi-conductor zone growth support. This means that III-V semi-conductor zones can be obtained whilst generating low levels of defects.

Figure 11A:
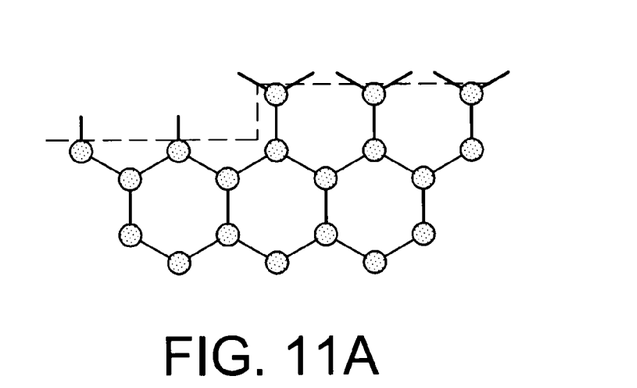

Such defects, mainly of antiphase boundaries, are generated when the Si pendant bonds are not in the same direction (FIG. 11A).

Figure 11B:
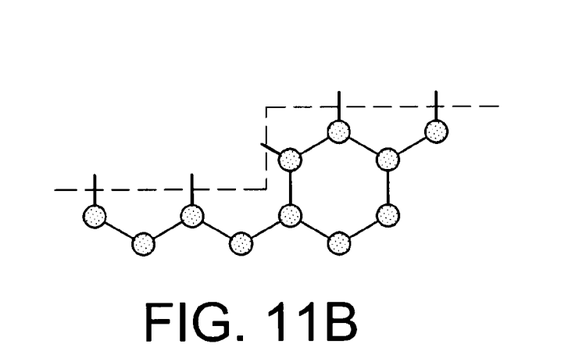

The use of weakly disoriented surfaces means that surfaces are obtained which have the majority of Si pendant bonds in the same direction. Thus the generation of the aforementioned type of defect is appreciably reduced (FIG. 11B).

One of the methods described above for obtaining an SGOI layer with a horizontal Ge concentration gradient followed by an etching or oxidation method which has $Si_{1-x}Ge_x$ consumption kinetics which are dependent on the concentration x of Ge, allows locally disoriented surfaces to be used.

Figure 5A:
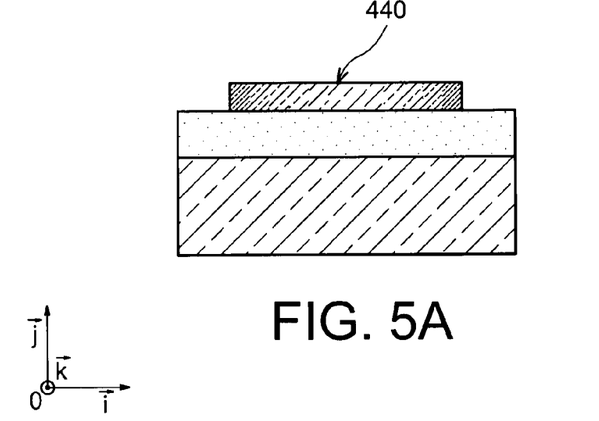
FIGS. 5A-5B: illustrate an example of the realization of locally disoriented surfaces or faces from a structure which includes a semi-conductor zone based on $Si_{1-z}Ge_z$ with a horizontal Ge concentration gradient, obtained using a method in accordance with the invention.

The realization of vicinal surfaces Sv may be achieved using a semi-conductor zone 440 based on $Si_{1-z}Ge_z$ (FIG. 5A) which exhibits a Ge concentration gradient in a direction which is horizontal or parallel to the principal plane of this zone.

Figure 5B:
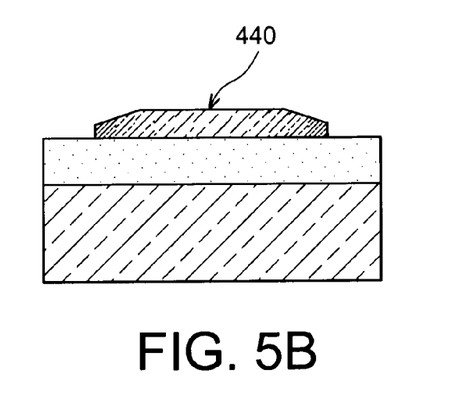

Such surfaces may be made using etching whose kinetics depend on the percentage of Ge, using a wet method using, for example, HF—HNO3-$CH_3COOH$—HNA, or using plasma etching, for example delocalised $CF_4$ plasma etching. The etching method that enables locally disoriented surfaces to be obtained may be a vapour phase chemical etching or CVE ("Chemical vapour etching") method using, for example, HCl mixed with a carrier gas, for example hydrogen or nitrogen. This etching, whose kinetics depend on the percentage of Ge in the zones with horizontal Ge gradients that are formed, may be used at a temperature which may be between 450° C. and 900° C. The etching temperature may be chosen to be less than or equal to 700° C. At this temperature the etching, in addition to being selective between two SiGe zones with different Ge concentrations, is extremely selective towards the surrounding silicon, for example the substrate silicon, with the speed of etching of the silicon being low, that is, at least less than 0.1 nm/min. The total pressure of the gas mixture during etching is, for example, between 200 and 101,300 Pa. The partial pressure of hydrogen may be, for example, between 20 and 24,000 Pa. The flow of the etching gas mixture may be, for example, between several standard liters and several tens of standard liters per minute. The flow of HCl may be between several hundred centimeters cubed per minute and several tens of standard liters per minute. The etching time may be between several seconds and several hundred seconds (FIG. 5B).

According to one variant, the surfaces may be made by wet path oxidation.

A disoriented surface may be formed using one or the other of the methods that have just been described.

By suitably altering the concentration $z_i$ of Ge of semi-conductor zones based on $Si_{1-zi}Ge_{zi}$, the angle of the locally disoriented surface obtained from a structure as described previously in association with FIG. 3B may be adjusted.

FIGS. 6A-6D and 7A-7D show two examples of the method for fabrication locally disoriented surfaces with different angles from semi-conductor zones based on an alloy of Si and Ge and which have different Ge concentrations.

Figure 6A:
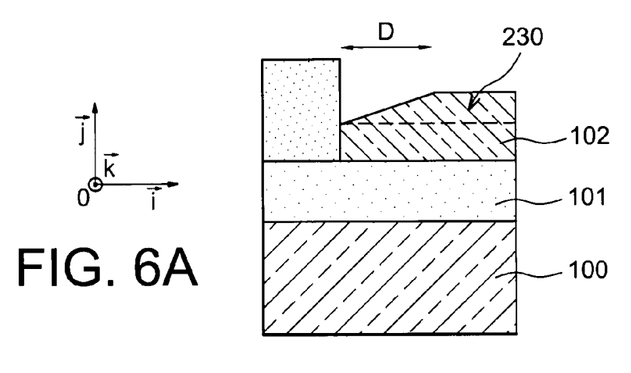
FIGS. 6A-6D and 7A-7D: illustrate the effect of Ge concentration in the SiGe zones, formed using the steps of a method according to the invention, on the angle of locally disoriented surfaces made using a method according to the invention.
Figure 6B:
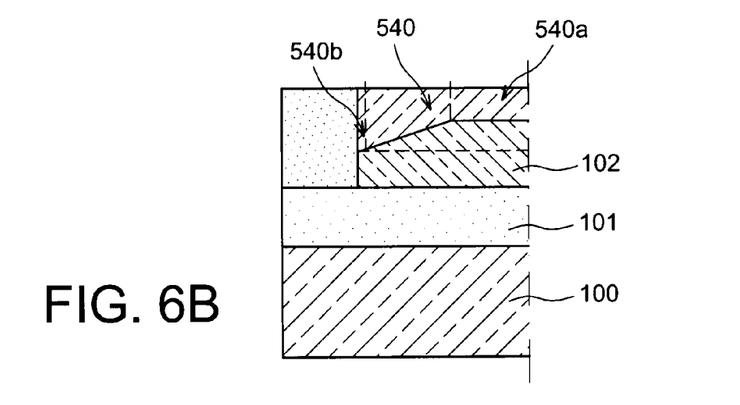
Figure 7A:
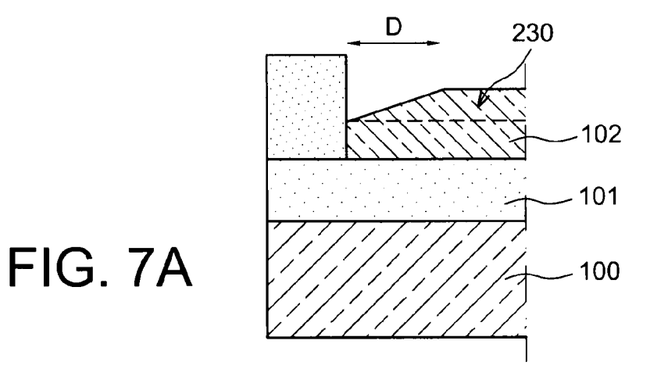
Figure 7B:
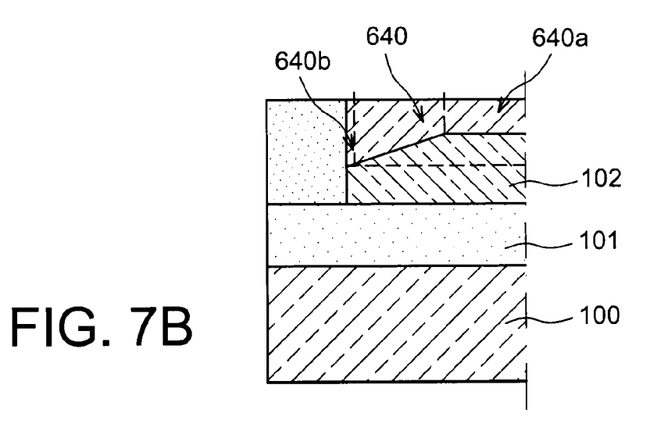

An SOI substrate as described previously with an upper thin Si layer 102, which in this example is of the order of 10 nm, may be used as a stating material.

Using local Si epitaxy, a semi-conductor layer 230 is formed, for example of the order of 20 nm, on the thin semi-conductor layer 102. The semi-conductor zone 230 may be such that over a distance D of the order of 100 nm, close to the oxidation masking layer 208, the Si layer decreases from 30 to 10 nm from its centre towards its extremities (FIGS. 6A and 7A).

In a first case epitaxy of $Si_{1-x1}Ge_{x1}$ is carried out where $x1=0.1$, in order to form a semi-conductor zone 540 based on Si with a thickness of 40 nm.

In a second case epitaxy of $Si_{1-x2}Ge_{x2}$ is carried out where $x2=0.2$, in order to form a semi-conductor zone 640 based on $Si_{1-x2}Ge_{x2}$ with a thickness of 40 nm.

The thickness $E_{masque}$ of the oxidation masking layer 208 used may in turn be of the order of 50 nm, so that $E_{masque}=E_{SiGe}+E_{Si}$, (where $E_{Si}$ is the thickness of the layer 102 and $E_{SiGe}$ the thickness of zones 540 and 640).

In the first case (FIG. 6B), after the mechanical-chemical planarisation step, a semi-conductor zone 540 may be obtained which may have, in a central region 540a, a thickness of 20 nm of $Si_{0.9}Ge_{0.1}$ and which may rest on a thickness of 30 nm of Si, and in a peripheral region 540b a thickness of 40 nm of $Si_{0.9}Ge_{0.1}$ resting on a thickness of 10 nm.

In the second case (FIG. 7B), after the mechanical-chemical planarisation step, a semi-conductor zone 640 may be obtained which may have in a central region 640a a thickness of 20 nm of $Si_{0.8}Ge_{0.2}$ and which may rest on a thickness of 30 nm of Si and in a peripheral region 640b a thickness of 40 nm of $Si_{0.8}Ge_{0.2}$ resting on a thickness of 10 nm.

Figure 6C:
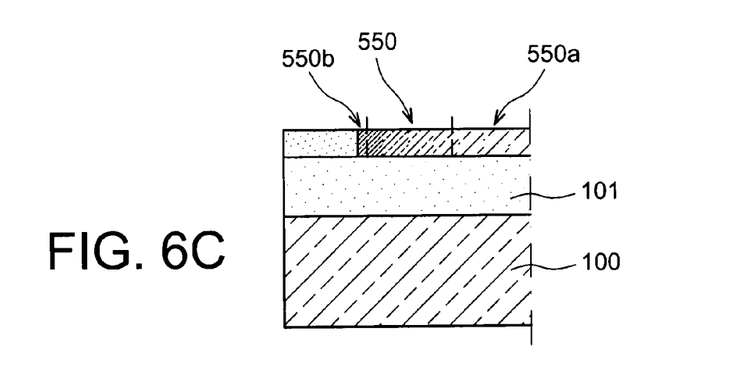
Figure 7C:
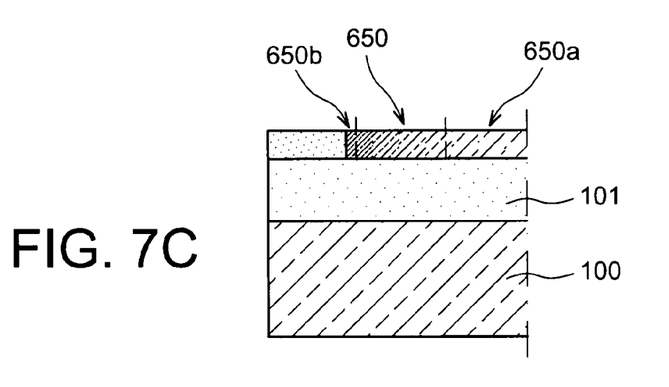

Condensation of Ge by oxidation is then carried out so as to obtain a $Si_zGe_{1-z}$ semi-conductor zone with a thickness, for example, of the order of 10 nanometers.

In the first case a semi-conductor zone 550 may be obtained which, in a central region 550a, may be based on $Si_{0.8}Ge_{0.2}$ and in a peripheral region 550b may be based on $Si_{0.6}Ge_{0.4}$ (FIG. 6C). In this case the difference between the two extreme concentrations of Ge is of the order of 20% in the semi-conductor zone 550.

In the second case a semi-conductor zone 650 may be obtained which, in a central region 650a, may be based on $Si_{0.8}Ge_{0.4}$ and in a peripheral region 650b may be based on $Si_{0.2}Ge_{0.8}$ (FIG. 7C). In this case the difference between the two extreme concentrations of Ge is of the order of 40% in the semi-conductor zone 650.

Thus in a zone 550 or 650 of the order of 100 nm wide, in the first case a gradient $\Delta$ of the order can be obtained and in the second case a gradient $\Delta$ of the order of 40% can be obtained.

Figure 6D:
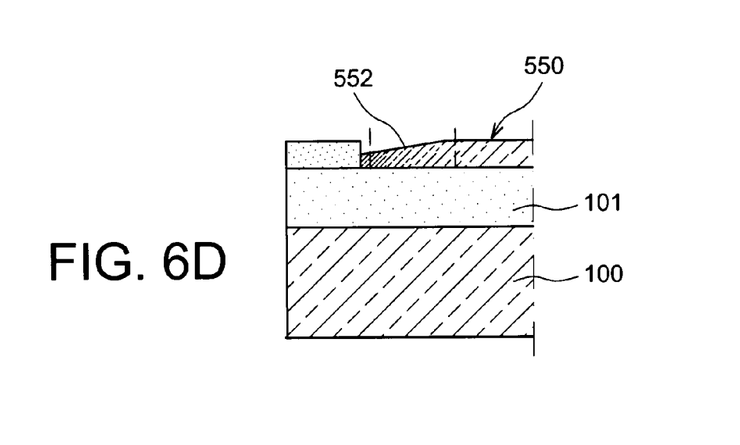
Figure 7D:
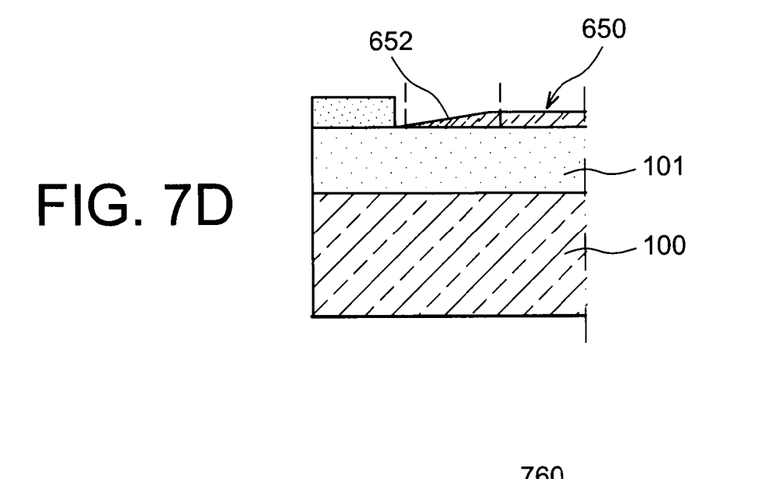

Then locally disoriented surfaces are formed by applying an oxidation or etching method as described beforehand whose $Si_{1-z}Ge_z$ consumption kinetics depend on the concentration z.

The sharpness of the disoriented surfaces obtained is dependent on the value of the concentration gradient. The semi-conductor zone 550 obtained in the first case may include a region 552 which makes an angle $\alpha$ with the principal plane of the substrate (defined in FIG. 6D as a plane parallel to the plane [O;;] of an orthogonal identifier [O;;;]) which depends on the Ge concentration gradient in the semi-conductor zone 550. The semi-conductor zone 550 obtained in the second case may have an angle $\beta>\alpha$ (angle $\beta$ in FIG. 6D) which also depends on the Ge concentration gradient in the semi-conductor zone 550.

Using one or the other of the method examples previously described, zones based on $Si_{1-x}Ge_x$ alloy may be made side by side or one on top of the other which have different Ge concentrations and which each exhibit a horizontal concentration gradient.

Figure 8:
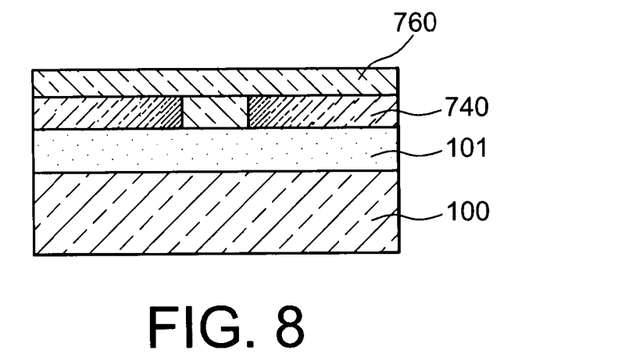
FIG. 8 illustrates an example of a microelectronic device according to the invention, equipped with a strained semi-conductor zone resting on a semi-conductor zone based on $Si_{1-z}Ge_z$ with a horizontal Ge concentration gradient.
Figure 9:
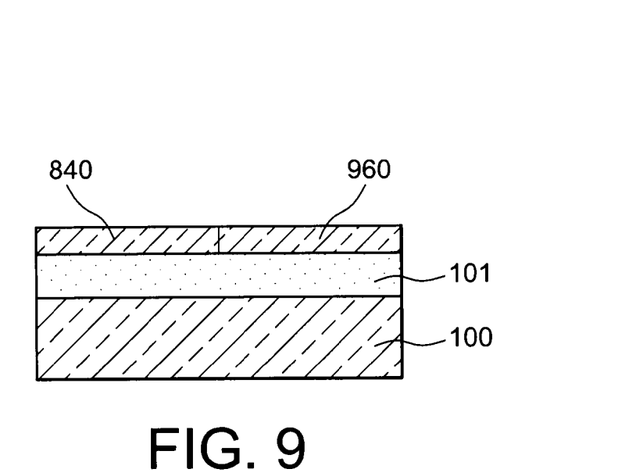
FIG. 9 illustrates an example of a device according to the invention, formed from a junction equipped with a first strained semi-conductor zone resting on a semi-conductor zone based on Si with a horizontal Ge concentration gradient, next to a second strained semi-conductor zone resting on a semi-conductor zone based on $Si_{1-z2}Ge_{z2}$ with a horizontal Ge concentration gradient.

Using one or the other of the method examples described previously, at least one strained semi-conductor zone 760 may also be formed, in particular a strained Si zone that has been formed by example by growth through epitaxy on a zone 740 based on $Si_{1-z}Ge_z$ alloy which exhibits a horizontal Ge concentration gradient.

A MOS transistor which includes semi-conductor zones based on $Si_{1-z}Ge_z$ alloy which exhibit a horizontal Ge concentration gradient may be used in the source and drain zones, where the SiGe enriched zones are preferably located close to the channel in order to stress the latter, whereas the SiGe zones with lower Ge concentrations are located at the ends of the source and drain zones in order to facilitate contacts.

In FIG. 10, a micro-electronic device which includes an $nSi_{1-z1}Ge_{z1}$-$pSi_{1-z2}Ge_{z2}$ heterojunction which includes a first semi-conductor zone 840 based on $Si_{1-z2}Ge_{z2}$ which has a first Ge concentration gradient in a horizontal direction, and a second $Si_{1-z2}Ge_{z2}$ semi-conductor zone 940 which has a second Ge concentration gradient in the horizontal direction, is shown. Zones 840 and 940 rest on the insulation layer 101 of a substrate and were formed using a method according to the invention.

The invention claimed is:

1. A method comprising:
   forming, on a support, at least one oxidation masking layer which includes one or more holes, where the one or more holes reveal at least one Si based semi-conductor zone including inclined flanks and having a central portion and a periphery portion, said periphery portion having a thickness smaller than the central portion thickness,
   forming at least one $Si_{1-x}Ge_x$, where $0<x$, based semi-conductor zone on said at least one Si based semi-conductor zone,
   conducting thermal oxidation of said at least one Si based semi-conductor zone and said $Si_{1-x}Ge_x$ based semi-conductor zone through said masking layer so as to obtain a semi-conductor zone with a germanium concentration gradient in a direction parallel to a principal plane of said support, said germanium concentration gradient having germanium content increasing from a center to a periphery of said semi-conductor zone with the germanium concentration gradient, and
   etching said semi-conductor zone with the germanium concentration gradient, said etching having kinetics dependent upon a percentage of germanium in said semi-conductor zone with the germanium concentration gradient.

2. The method according to claim 1, wherein said Si based semi-conductor zone and said $Si_{1-x}Ge_x$ based semi-conductor zone form a block with a ratio of $Si_{1-x}Ge_x$ thickness compared to Si thickness increasing from a center to a periphery of said block.

3. The method according to claim 1, wherein said Si based semi-conductor zone has inclined flanks oriented according to $\{11n\}$ (with $n \geq 1$).

4. The method according to claim 1, wherein said support is an SOI substrate that includes a support layer, an insulating layer resting on said support layer and a thin semi-conductor layer resting on said insulating layer.

5. The method according to claim 4, wherein said forming of said at least one oxidation mask layer includes growing said Si based semi-conductor zone on the thin semi-conductor layer.

6. The method according to claim 4, wherein said forming of said at least one oxidation mask layer includes:
  forming one or more openings in the thin semi-conductor layer,
  filing said one or more openings with said at least one oxidation mask layer, and
  growing said Si based semi-conductor zone on said thin semi-conductor layer.

7. The method according to claim 1, wherein said forming said at least one $Si_{1-x}Ge_x$ based semi-conductor zone includes having said at least one $Si_{1-x}Ge_x$ based semi-conductor zone extend beyond an opening of the one or more holes, and the method further includes:
  planarizing said at least one $Si_{1-x}Ge_x$ based second semi-conductor zone to a level of the at least one masking layer.

8. The method according to claim 1, further comprising:
  between the forming the at least one $Si_{1-x}Ge_x$ based semi-conductor zone and said conducting thermal oxidation, removing a thickness of the at least one $Si_{1-x}Ge_x$ based semi-conductor zone and of the at least one masking layer, so as to reveal the Si based semi-conductor zone.

9. The method according to claim 1, further comprising:
  after said forming the at least one $Si_{1-x}Ge_x$ based semi-conductor zone, removing said at least one masking layer and of at least one layer of $SiO_2$ formed during said thermal oxidation.

10. The method according to claim 1, wherein the at least one $Si_{1-x}Ge_x$ based semi-conductor zone has a Ge concentration of between 5% and 40%.

11. A method comprising:
  forming, on a support, at least one oxidation masking layer which includes one or more holes, where the one or more holes reveal at least one Si based semi-conductor zone including inclined flanks and having a central portion and a periphery portion, said periphery portion having a thickness smaller than the central portion thickness,
  forming at least one $Si_{1-x}Ge_x$ (where $0<x$) based semi-conductor zone on said at least one Si based semi-conductor zone, and
  conducting thermal oxidation of said at least one Si based semi-conductor zone and said $Si_{1-x}Ge_x$ based semi-conductor zone through said masking layer,
  wherein the method further includes, between the forming the at least one $Si_{1-x}Ge_x$ based semi-conductor zone and said conducting thermal oxidation, removing a thickness of the at least one $Si_{1-x}Ge_x$ based semi-conductor zone and of the at least one masking layer, so as to reveal the Si based semi-conductor zone.

12. A method comprising:
  forming, on a support, at least one oxidation masking layer which includes one or more holes, where the one or more holes reveal at least one Si based semi-conductor zone including inclined flanks and having a central portion and a periphery portion, said periphery portion having a thickness smaller than the central portion thickness,
  forming at least one $Si_{1-x}Ge_x$ (where $0<x$) based semi-conductor zone on said at least one Si based semi-conductor zone, wherein said at least one $Si_{1-x}Ge_x$ based semi-conductor zone extends beyond an opening of the one or more holes,
  wherein said Si based semi-conductor zone and said $Si_{1-x}Ge_x$ based semi-conductor zone form a block with a ratio of $Si_{1-x}Ge_x$ thickness compared to Si thickness increasing from a center to a periphery of said block,
  after forming said at least one $Si_{1-x}Ge_x$ based semi-conductor zone, planarizing said at least one $Si_{1-x}Ge_x$ based semi-conductor zone to a level of the at least one masking layer, so as to render said block flat and modify said ratio of $Si_{1-x}Ge_x$ thickness compared to Si thickness, and
  after the planarizing, conducting thermal oxidation of said at least one Si based semi-conductor zone and said $Si_{1-x}Ge_x$ based semi-conductor zone through said masking layer.

* * * * *

UNITED STATES PATENT AND TRADEMARK OFFICE
CERTIFICATE OF CORRECTION

PATENT NO.         : 8,501,596 B2
APPLICATION NO.    : 12/560867
DATED              : August 6, 2013
INVENTOR(S)        : Benjamin Vincent et al.

Page 1 of 1

It is certified that error appears in the above-identified patent and that said Letters Patent is hereby corrected as shown below:

On the title page, Item (73), the Assignee's Information is incorrect. Item (73) should read:

--(73)   Assignee:   Commissariat a l'Energie Atomique,
                     Paris (FR)--

Signed and Sealed this
Twenty-fourth Day of September, 2013

Teresa Stanek Rea
*Deputy Director of the United States Patent and Trademark Office*